United States Patent [19]

Garuts

[11] Patent Number: 5,049,837
[45] Date of Patent: Sep. 17, 1991

[54] PUSH-PULL TRANSFORMER COUPLED RF AMPLIFIER WITH RESPONSE TO DC

[75] Inventor: Valdis E. Garuts, Beaverton, Oreg.

[73] Assignee: Tektronix, Inc., Beaverton, Oreg.

[21] Appl. No.: 542,560

[22] Filed: Jun. 25, 1990

[51] Int. Cl.[5] .............................................. H03F 3/45
[52] U.S. Cl. .................................... 330/301; 330/195; 330/252
[58] Field of Search ............... 330/252, 255, 262, 301, 330/188, 195, 196

[56] References Cited

U.S. PATENT DOCUMENTS 4,945,317 7/1990 Sato et al. ........................... 330/301

OTHER PUBLICATIONS

H. Granberg, "Broadband Linear Power Amplifier Using Push-Pull Transistors," AN593, Motorola RF Device Data Manual, vol. 2, 4/88.

H. Granberg, "Low Distortion 1.6 to 30 MHz SSb Driver Designs," AN779, Motorola RF Device Data Manual, vol. 2, 4/88.

"35/50 Watt Broadband (160-240 MHz) Push-Pull TV Amplifier Band III," AN1028, Motorola RF Device Data Manual, vol. 2, 4/88.

D. Feeney, "RF Linear Hybrid Amplifiers," AN 1024, Motorola RF Device Data Manual, vol. 2, 4/88.

Primary Examiner—Steven Mottola
Attorney, Agent, or Firm—William Y. Conwell

[57] ABSTRACT

A transformer-based coupling network permits a push-pull amplifier to be used with single ended signals, while providing constant gain and, if desired, bidirectional impedance matching, from RF down to DC.

9 Claims, 3 Drawing Sheets

5,049,837

PUSH-PULL TRANSFORMER COUPLED RF AMPLIFIER WITH RESPONSE TO DC

FIELD OF THE INVENTION

The present invention relates to amplifier circuitry, and more particularly relates to a transformer coupled push-pull amplifier that provides flat response down to DC.

BACKGROUND AND SUMMARY OF THE INVENTION

A common requirement of amplifiers is high efficiency, low distortion amplification of essentially sine wave signals. In communication and instrumentation applications, the source and load are usually single ended. However, the low distortion requirement is usually best satisfied by a balanced, push-pull circuit configuration. In such circuit configurations, the even harmonic distortion components cancel, leaving the third harmonic component as the dominant distortion source. For amplifiers employing bipolar transistors, this third harmonic component is relatively small.

The usual way to employ push-pull amplifiers with single ended signals is to use a pair of push-pull emitter coupled or grounded emitter transistors for the amplifier, with the input power coupled to the bases through a single ended-to-balanced transformer, and the output power coupled from collectors to load through a balanced to single ended transformer. Examples of this prior art methodology are found in Application Notes 593, 779, 1028 and 1024, Motorola RF Device Data Manual, Volume 2, April, 1988. This arrangement provides the requisite power efficiency and low distortion for frequencies above the low frequency cutoff of the input and output transformers. However, in cases where it is necessary to maintain both constant gain and matched terminations down to DC, conventional transformer coupled circuits cannot be used.

In accordance with the present invention, a push-pull amplifier circuit is provided with a new coupling circuit that connects the push-pull outputs to a single ended load. This circuit delivers the output power of both amplifying devices to the load at high frequencies, provides constant gain and output power down to DC, and, if desired, provides constant bidirectional output impedance matching from RF to DC.

The foregoing and additional features and advantages of the present invention will be more readily apparent from the following detailed description, which proceeds with reference to the accompanying drawings.

DETAILED DESCRIPTION

Figure 1:
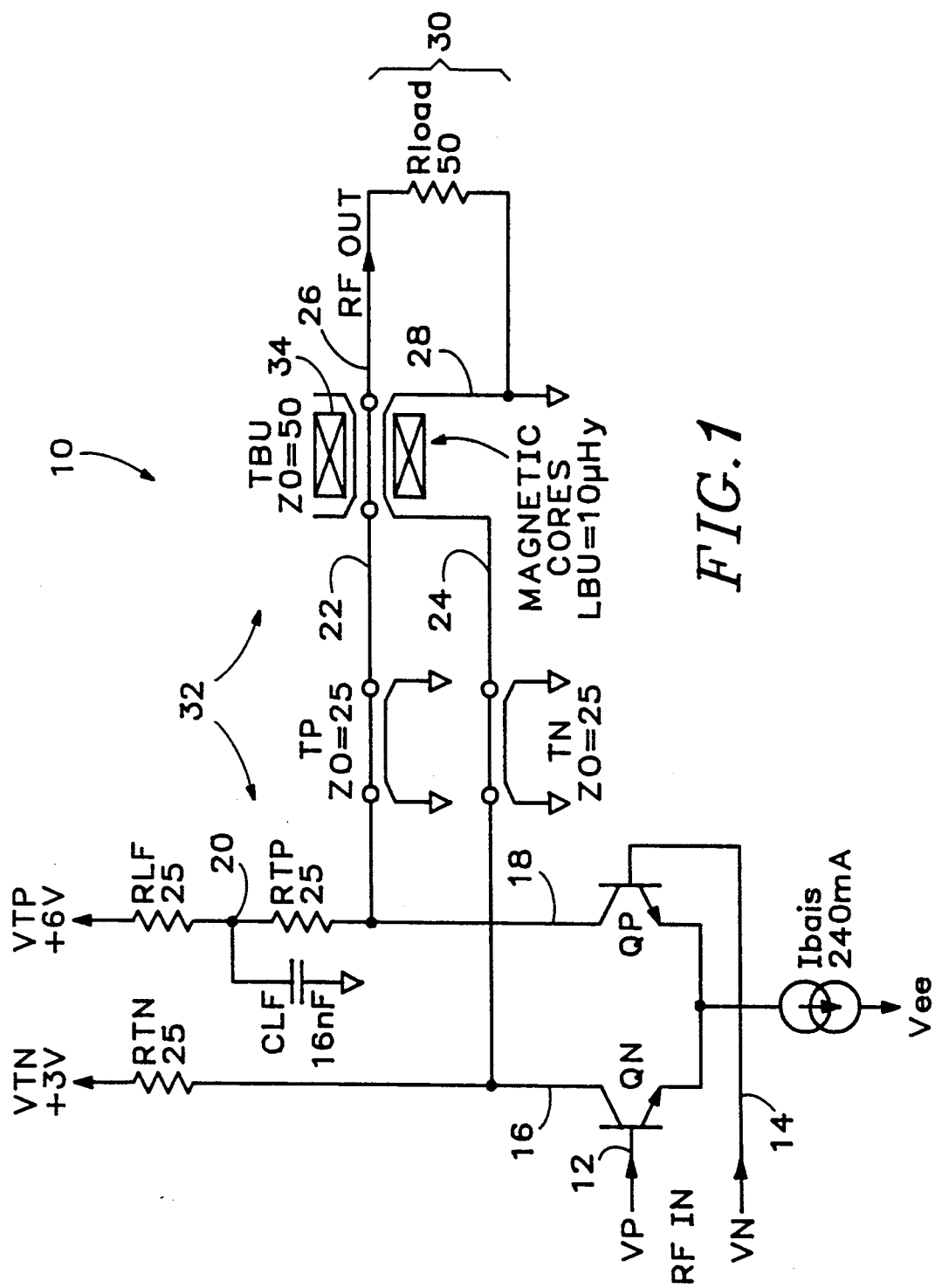
FIG. 1 is a schematic diagram of an amplifier according to one embodiment of the present invention, having a balanced input and a single ended output.

Referring first to FIG. 1, an amplifier 10 according to one embodiment of the present invention comprises a pair of differentially coupled bipolar transistors $Q_N$, $Q_P$ having first and second input terminals 12, 14, and first and second balanced output terminals 16, 18. A first resistor $R_{IN}$ couples the first balanced output terminal 16 to a first power source $V_{TN}$. Second and third series connected resistors $R_{TF}$, $R_{LF}$ couple the second balanced output terminal 18 to a second power source $V_{TP}$. A node 20 between the second and third resistors is shunted to ground through a capacitor $C_{LF}$.

The amplifier 10 further includes a coaxial transmission line balun transformer $T_{BU}$ having first and second input terminals 22, 24, and first and second output terminals 26, 28. The first and second input terminals 22, 24 are coupled to the first and second balanced output terminals of transistors $Q_P$ and $Q_N$, respectively. The first and second transformer output terminals 26, 28 define a single ended amplifier output port 30.

Resistors $R_{TN}$, $R_{TP}$, $R_{LF}$, capacitor $C_{LF}$, and balun transformer $T_{BU}$ define a coupling network 32. Resistors $R_{TN}$ and $R_{TP}$ serve as bias and reverse termination resistors. Resistor $R_{LF}$ and capacitor $C_{LF}$ form a crossover network that maintains constant amplifier output to DC. The characteristic impedance of $T_{BU}$ equals $R_{load}$. The values of $R_{TN}$, $R_{TP}$ and $R_{LF}$ are half that of $R_{load}$ to provide an output reverse termination equal to $R_{load}$. When such a reverse termination is not needed, these resistor values may be increased to reduce loss of output power therein.

The illustrated amplifier 10 further includes two transmission lines $T_P$, $T_N$. These lines are not essential, but may be used to transmit the output power physically away from the amplifier transistors $Q_N$, $Q_P$ and can serve as a convenient means to mount the amplifier output devices. If used, their impedances should be half of $R_{load}$.

The outer conductor of the transmission line balun $T_{BU}$ is grounded at its output end 28 and is surrounded along its length by magnetic cores 34 (illustrated in cross section). These cores cause the outer conductor to present an inductance $L_{BU}$ to ground to signals applied at input end 24. At high frequencies, the reactance of $L_{BU}$ is high, so the balun presents a floating impedance of $R_{load}$ across nodes 22, 24. The amplifier output power is delivered via $T_{BU}$ to $R_{load}$.

The amplifier 10 is illustrated with circuit values and bias voltages/currents selected to yield an output of 5 volts peak to peak into a 50 ohm load, and to provide a fully matched back termination.

Idealized Operation

Figure 2:
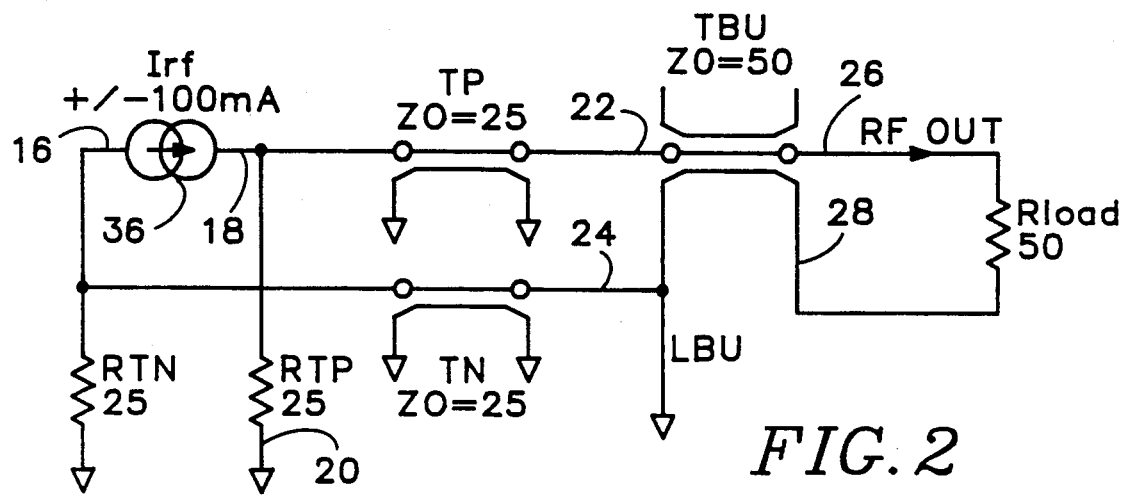
FIG. 2 is a high frequency equivalent circuit of the amplifier of FIG. 1.
Figure 3:
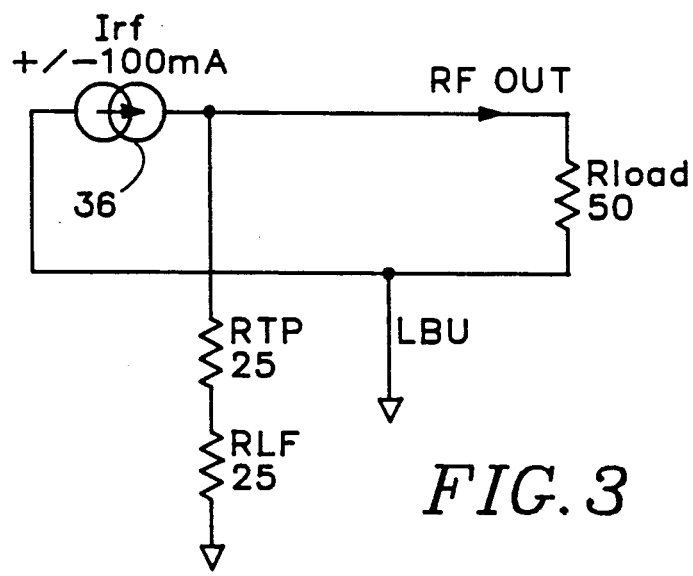
FIG. 3 is a DC equivalent circuit of the amplifier of FIG. 1.
Figure 4:
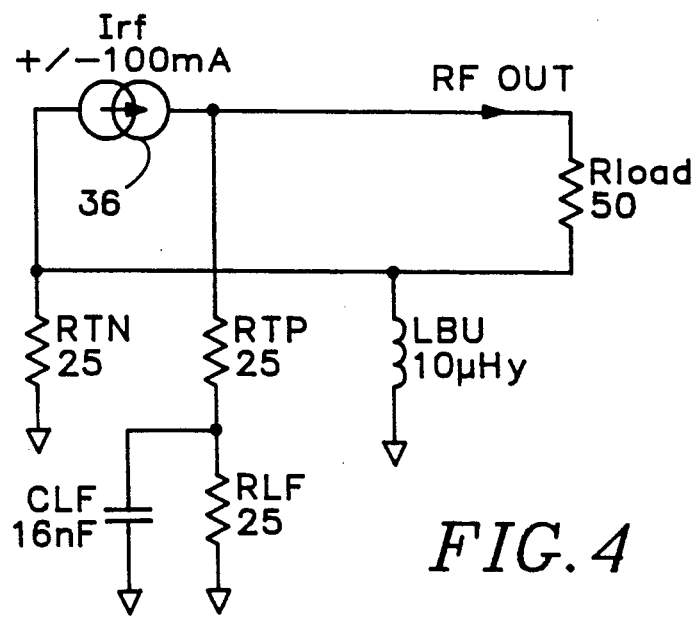
FIG. 4 is a crossover equivalent circuit of the amplifier of FIG. 1.

The ideal linearized small signal behavior of the amplifier 10 is considered at high frequency, DC, and in the crossover frequency range using the equivalent circuits of FIGS. 2–4. It is assumed for simplicity that the amplifier's output can be modelled by a floating current source $I_{rf}$ 36, which is a first-order approximation to the collectors of a push-pull emitter-coupled amplifier.

The high frequency equivalent circuit is shown in FIG. 2. Here capacitor $C_{LF}$, effectively grounds the second end 20 of $R_{TP}$, and the impedance of $L_{BU}$ effectively disconnects the input end of the balun's outer conductor 24 from ground. Some of each end of $I_{rf}$ flows into the 25 ohms presented by $T_P$ and $T_N$, and the rest into resistors $R_{TN}$ and $R_{TP}$. To maintain AC balance, i.e. equal and opposite signal voltages at nodes 18 and 16, $R_{TN}$ and $R_{TP}$ must be equal. The 50 ohm impedance presented across the inputs 22, 24 by the balun transformer $T_{BU}$ fully matches the two 25 ohm in series output impedances of $T_P$, $T_N$. Similarly, $R_{load}$ fully terminates $T_{BU}$. Thus, all of the power entering $T_N$, $T_P$ is delivered to $R_{load}$. The signal voltage across $R_{load}$ is the same as across nodes 18, 16, and is therefore twice the voltage from node 18 or 16 to ground.

Any energy reflected by $R_{load}$ enters $T_{BU}$ at output terminals 26, 28 and propagates through a fully matched path comprising $T_{BU}$, $T_P$ and $T_N$ (if present), and is partly absorbed and partly reflected by resistors $R_{TN}$ and $R_{TP}$.

If the sum of $R_{TP}$ and $R_{TN}$ equals 50 ohms (i.e. 25 ohms each for a balanced system) then $T_{BU}$ (and $T_P$ and $T_N$ if present) are terminated, i.e. the amplifier is fully back terminated. For this case, the total load impedance across $I_{rf}$ is 25 ohms, giving a total voltage across it, and across $R_{load}$, of ±2.5 volts for the illustrated ±100 mA signal current.

The DC equivalent circuit of amplifier 10 is shown in FIG. 3. At DC, the transmission line segments are short circuits. $R_{TN}$ and the left end of $I_{rf}$ are grounded by $L_{BU}$. The right end of $I_{rf}$ drives a load consisting of $R_{load}$ in parallel with the series combination of $R_{TP}$ and $R_{LF}$. The resulting voltage across $R_{load}$ is the same as in the high frequency analysis, because the load across the output current $I_{rf}$ is the same as at HF for these component values. For DC gain equal to the HF gain, $R_{LF}$ must be equal to $R_{TP}$. Capacitor $C_{LF}$ is effectively an open circuit, so the back-termination is the series combination of $R_{TP}$ and $R_{LF}$. If $R_{TP}$ and $R_{LF}$ both equal 25 ohms, then the back termination provides a match at DC.

The equivalent circuit in the crossover frequency range is in FIG. 4. Here the impedances of capacitor $C_{LF}$ and inductor $L_{BU}$ are neither very low nor very high as compared with the resistors. However, the frequencies are low enough that the transmission line $T_P$, $T_N$ delays and capacitances are negligible and are omitted. Circuit analysis and simulation show that the power delivered to the load $R_{load}$ in the crossover range of frequencies is constant provided that:

$$L_{BU}/R_{TN} = C_{LF} \cdot R_{LF} \qquad (1)$$

This condition also maintains a constant resistance looking back into the amplifier from $R_{load}$. If all resistors are half of $R_{source}$ (i.e. 25 ohms), then full back-termination is again maintained.

Single Ended Input Embodiment

Figure 5:
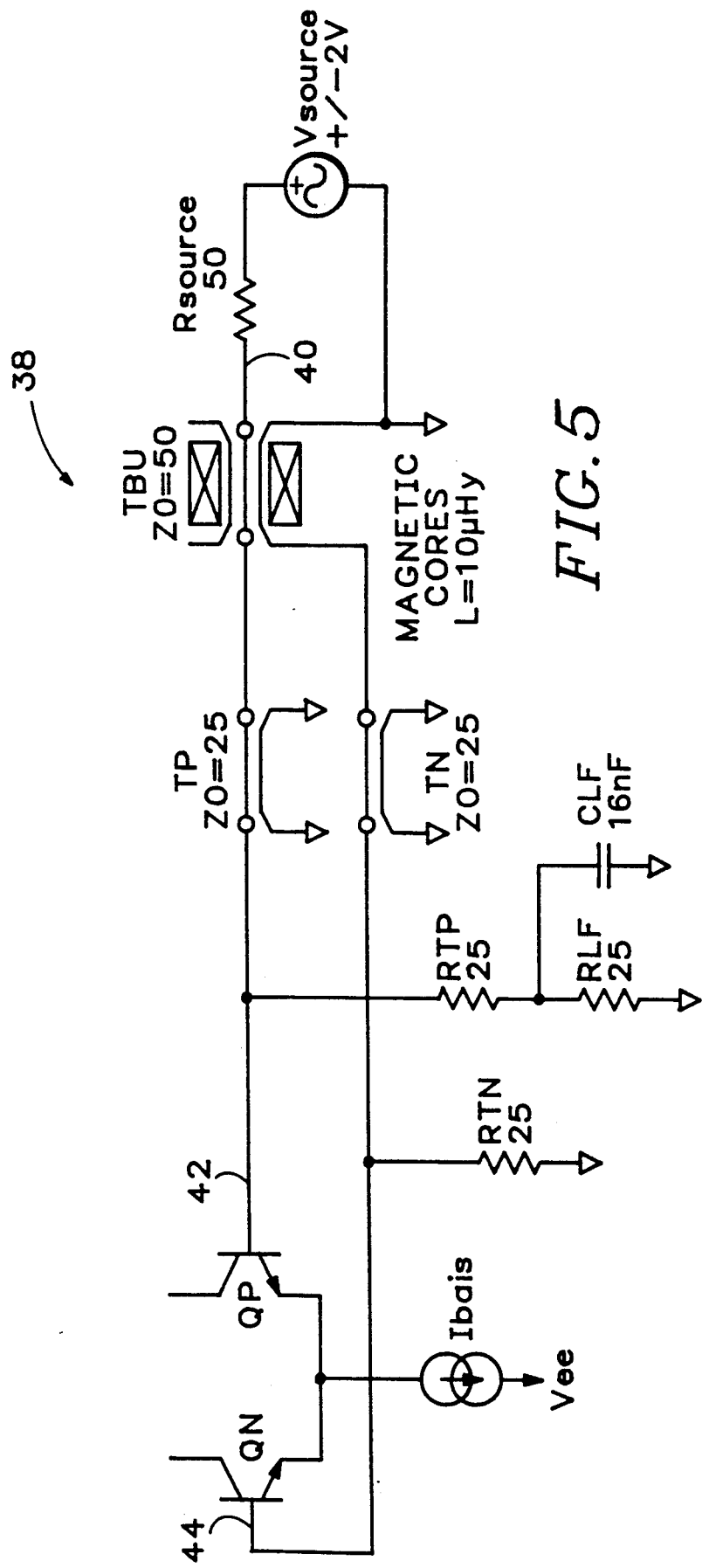
FIG. 5 is a schematic diagram of an amplifier according to a second embodiment of the present invention, having a single ended input and a balanced output.

A similar coupling network can also be used to connect the input of a differential amplifier to a single ended source, as shown in FIG. 5. The single ended signal source is represented by $V_{source}$ and its impedance by $R_{source}$.

In the illustrated single ended-input amplifier 38, $R_{source}$ is assumed to be 50 ohms, and $V_{source}$ is ±2 volts.

As will be recognized from the preceding discussion, the impedance looking into balun $T_{BU}$ at node 40 for the fully terminated case is a constant 50 ohms from DC on up. Therefore, the voltage at node 40 is a constant ±1 volt. The voltage across the amplifier's inputs 42, 44 is also a constant ±1 volt. If $R_{TP}$, $R_{TN}$, and $R_{LF}$ are not 25 ohms, then a constant signal amplitude is still applied across the amplifier's input, from DC to high frequency, but some of the signal is reflected back to the source, i.e. the input is not fully forward terminated.

From the foregoing, it will be recognized that an amplifier according to the present invention permits use of push-pull amplifier topologies with single ended signals while providing constant gain and, if desired, constant bidirectional impedance matching from RF to DC.

Having described and illustrated the principles of my invention with reference to two preferred embodiments, it will be apparent that the invention can be modified in arrangement and detail without departing from such principles. For example, while the invention has been illustrated with reference to single ended-to-balanced, and balanced-to-single ended forms, it will be recognized that single ended-to-single ended, and balanced-to-balanced forms can be constructed by combining the teachings of the FIGS. 1 and 5 embodiments. Similarly, while the invention has been described with reference to a push-pull amplifier employing bipolar transistors, it will be recognized that the principles thereof are equally applicable to a number of other wide band circuits.

In view of the many possible embodiments to which the principles of my invention may be put, it should be recognized that the detailed embodiments are illustrative only and should not be taken as limiting the scope of my invention. Rather, I claim as my invention all such embodiments as may come within the scope and spirit of the following claims and equivalents thereto.

I claim:

1. An amplifier comprising:
   push-pull connected amplifying means having first and second balanced input terminals and first and second balanced output terminals, for amplifying input signals applied to the input terminals;
   first load means for coupling the first balanced output terminal to a first power source, said first load means having a first impedance;
   second and third load means, each having first and second terminals, the first terminal of the second load means being coupled to the second balanced output terminal, the second terminal of the second load means being coupled to the first terminal of the third load means, and the second terminal of the third load means being coupled to a second power source, said second and third load means having second and third impedances, respectively, each equal to said first impedance;
   capacitive means for capacitively coupling the second terminal of the second load means to ground;
   a balun transformer having first and second input terminals and first and second output terminals with a common mode inductance between said input and output terminals, the first and second transformer input terminals being coupled to the first and second balanced output terminals, respectively; and
   the first and second transformer output terminals defining a single-ended amplifier output port.

2. The amplifier of claim 1 in which a load having an impedance $Z_{load}$ is connected across the amplifier output port and in which the first, second and third load impedances are each equal to half of $Z_{load}$.

3. The amplifier of claim 1 in which a load having an impedance $Z_{load}$ is connected across the amplifier output port and in which a time constant defined by the capacitive means and the third impedance is equal to a time constant defined by the common mode inductance and the first impedance.

4. The amplifier of claim 1 in which a load having an impedance $Z_{load}$ is connected across the amplifier output port and in which the balun transformer comprises a transmission line having a characteristic impedance with a value equal to $Z_{load}$.

5. The amplifier of claim 1 in which the balun transformer comprises a coaxial transmission line with magnetic elements disposed therearound.

6. An amplifier comprising:
   push-pull connected amplifying means having first and second balanced input terminals and first and second balanced output terminals;
   first load means coupling the first balanced input terminal to ground, said first load means having a first impedance;
   second and third load means, each having first and second terminals, the first terminal of the second load means being coupled to the second balanced input terminal, the second terminal of the second load means being coupled to the first terminal of the third load means, and the second terminal of the third load means being coupled to ground, said second and third load means having second and third impedances, respectively, each equal to the first impedance;
   capacitive means for capacitively coupling the second terminal of the second load means to ground;
   a balun transformer having firs&: and second input terminals and first and second output terminals and defining a common mode inductance between said input and output terminals, the first and second transformer input terminals being coupled to a single-ended input port; and
   the first and second transformer output terminals being coupled to the second and first balanced input terminals, respectively.

7. The amplifier of claim 6 in which the balun transformer comprises a transmission line having a characteristic impedance equal to twice the first impedance.

8. An amplifier comprising:
   first and second amplifier means for producing push-pull output currents from first and second output terminals in response to balanced input signals applied to first and second input terminals;
   a two conductor balun transformer having input terminals coupled to the amplifier means output terminals and having output terminals coupled to a single-ended output port, the transformer exhibiting a common-mode inductance L; and
   amplifier bias means coupling the first and second amplifier means to bias signals and to ground, for:
   providing constant amplifier gain from an upper frequency limit down to DC; and
   providing bidirectional impedance matching between the single-ended output port and the first and second amplifier means from said upper frequency limit down to DC.

9. The amplifier of claim 8 in which the amplifier bias means comprises:
   first load means coupling the first amplifier means output terminal to a bias source;
   second and third serially connected load means for coupling the second amplifier means output terminal to a bias source; and
   capacitive means coupling a junction between the second and third serially connected load means to ground, said capacitive means exhibiting a capacitance C;
   wherein:
   the first, second and third load elements all exhibit an impedance Z; and
   the values of Z, C and L are related so that $C = L/R^2$.

* * * * *